(12) United States Patent
Suemasa

(10) Patent No.: US 9,384,993 B2
(45) Date of Patent: Jul. 5, 2016

(54) OXIDE ETCHING METHOD

(71) Applicant: TOKYO ELECTRON LIMITED, Tokyo (JP)

(72) Inventor: Tomoki Suemasa, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/550,778

(22) Filed: Nov. 21, 2014

(65) Prior Publication Data

US 2015/0079801 A1   Mar. 19, 2015

Related U.S. Application Data

(63) Continuation of application No. PCT/JP2013/060294, filed on Apr. 4, 2013.

(30) Foreign Application Priority Data

May 23, 2012 (JP) ................................. 2012-117990

(51) Int. Cl.
*H01L 21/3065* (2006.01)
*H01L 21/762* (2006.01)
*H01L 21/311* (2006.01)
*H01L 21/67* (2006.01)

(52) U.S. Cl.
CPC ...... *H01L 21/3065* (2013.01); *H01L 21/31116* (2013.01); *H01L 21/67069* (2013.01); *H01L 21/762* (2013.01); *H01L 21/76224* (2013.01)

(58) Field of Classification Search
None
See application file for complete search history.

(56) References Cited

U.S. PATENT DOCUMENTS

| | | | | |
|---|---|---|---|---|
| 7,494,560 B2 * | 2/2009 | Newton et al. | | 156/345.34 |
| 7,510,972 B2 * | 3/2009 | Nishimura et al. | | 438/690 |
| 7,611,995 B2 * | 11/2009 | Hasebe et al. | | 438/723 |
| 7,622,392 B2 * | 11/2009 | Nishimura et al. | | 438/706 |
| 7,682,517 B2 * | 3/2010 | Nishimura et al. | | 216/58 |
| 7,765,077 B2 * | 7/2010 | Yamashita et al. | | 702/85 |
| 7,899,637 B2 * | 3/2011 | Yamashita et al. | | 702/85 |

(Continued)

FOREIGN PATENT DOCUMENTS

| | | |
|---|---|---|
| JP | 2005-039185 | 2/2005 |
| JP | 2007-201168 | 8/2007 |
| JP | 2008-160000 | 7/2008 |
| WO | 2011112812 | 9/2011 |

OTHER PUBLICATIONS

Ozawa et al., Work Processing Apparatus, Work Processing Method Therefor, Pressure Control Method, Work Carrying Method, and Carrying Apparatus, Abstract for JP2005-039185, Feb. 10, 2005, http://www19.ipdl.inpit.go.jp.

(Continued)

*Primary Examiner* — Allan Olsen

(57) ABSTRACT

An oxide etching method includes loading an object to be processed, on a surface of which a patterned silicon oxide film is formed, in a chamber, supplying HF gas and $NH_3$ gas as reactant gases and a diluent gas to the chamber to conduct a reaction treatment in which the HF gas and the $NH_3$ gas are reacted with the silicon oxide film. Thereafter, a heating process is performed to remove a reaction product generated by the reaction treatment. In the reaction treatment, a pressure in the chamber is increased to a predetermined value by increasing a flow rate of the diluent gas so that no etching residue remains and an etching shape has high verticality after the heating process.

6 Claims, 6 Drawing Sheets

(56) References Cited

U.S. PATENT DOCUMENTS

| | | | |
|---|---|---|---|
| 8,026,180 B2 * | 9/2011 | Greeley et al. | 438/710 |
| 8,440,568 B2 * | 5/2013 | Ugajin | 438/714 |
| 9,054,210 B2 * | 6/2015 | Park et al. | |
| 2004/0262254 A1 * | 12/2004 | Ozawa et al. | 216/2 |
| 2008/0171438 A1 * | 7/2008 | Sinha et al. | 438/689 |
| 2011/0035957 A1 | 2/2011 | Muraki et al. | |

OTHER PUBLICATIONS

Horiuchi, Natural Oxide Film Removing Method and Semiconductor Device Manufacturing Method, Abstract for JP2007-201168, Aug. 9, 2007, http://www19.ipdl.inpit.go.jp.

Muraki et al., Gas Processing Apparatus, gas Processing Method, and Storage Medium, Abstract for JP2008-160000, http://www19.ipdl.inpit.go.jp.

* cited by examiner

OXIDE ETCHING METHOD

CROSS-REFERENCE TO RELATED APPLICATION

This application is a Continuation Application of PCT International Application No. PCT/JP2013/060294 filed on Apr. 4 2013, which designated the United States.

FIELD OF THE INVENTION

The present invention relates to an oxide etching method for performing a chemical oxide removal process using a gaseous mixture containing hydrogen fluoride (HF) gas and ammonia ($NH_3$) gas.

BACKGROUND OF THE INVENTION

Recently, in a manufacturing process of a semiconductor device, a technique called chemical oxide removal (COR) has attracted attention as a micro etching method instead of dry etching or wet etching.

As the COR, there is known a process of etching a silicon oxide film by allowing hydrogen fluoride (HF) gas and ammonia ($NH_3$) gas to adsorb onto a silicon oxide film ($SiO_2$ film) present on the surface of a semiconductor wafer that is an object to be processed in a chamber maintained at a vacuum level, and to react with the silicon oxide film to generate ammonium fluosilicate (($NH_4)_2SiF_6$; AFS), and then having the ammonium fluosilicate sublimated by heating in the next step (see, e.g., Japanese Patent Application Publication No. 2005-39185 and Japanese Patent Application Publication No. 2008-160000).

In the case of etching the silicon oxide film as described above, the gaseous mixture of HF gas and $NH_3$ gas is reacted with the silicon oxide film under the conditions that the pressure in the chamber is 10-100 mTorr (1.33-13.3 Pa), the temperature of the semiconductor wafer is 30-40° C., and the flow rate of the total gas is 100-200 sccm (mL/min).

SUMMARY OF THE INVENTION

However, in the case of etching a patterned silicon oxide film on the surface of the wafer, an etching rate at the bottom of the pattern may decrease with miniaturization of the pattern, and the silicon oxide film may remain at the bottom of the pattern. When such an etching residue occurs, generally, the etching rate is increased by increasing the temperature of the process. However, when the temperature is increased, the etched shape becomes tapered.

In view of the above, the present invention provides an oxide etching method capable of etching with high verticality without generating an etching residue at a bottom of a pattern when a patterned silicon oxide film is etched by using a gaseous mixture of HF gas and $NH_3$ gas.

The present inventors have found that when an object to be processed on which a patterned silicon oxide film is formed is treated by using HF gas and $NH_3$ gas that are reactant gases, and a reaction product generated by reacting the reactant gases with the silicon oxide film is etched and removed by heating and decomposition, no etching residue occurs and an etching profile with high verticality can be obtained by adjusting the amount of a diluent gas added to the reactant gases to increase the pressure in the chamber.

In accordance with an aspect of the present invention, there is provided an oxide etching method including loading an object to be processed, on a surface of which a patterned silicon oxide film is formed, in a chamber, supplying HF gas and $NH_3$ gas as reactant gases to the chamber to conduct a reaction treatment in which the HF gas and $NH_3$ gas are reacted with the silicon oxide film, and performing a heating process to remove a reaction product generated by the reaction treatment, wherein a diluent gas is supplied to the chamber in addition to the HF gas and the $NH_3$ gas serving as reactant gases, and an amount of the diluent gas is adjusted to regulate a pressure in the chamber such that no etching residue remains and an etching shape has high verticality.

In the present invention, a temperature of the object to be processed in the reaction treatment is preferably equal to or less than 40° C., and the pressure in the chamber is equal to or greater than 200 mTorr. Preferably, the temperature of the object to be processed in the reaction treatment is equal to or less than 35° C.

It is preferred that a partial pressure of the HF gas is 5 to 50 mTorr, a partial pressure of the $NH_3$ gas is 5 to 50 mTorr, and a partial pressure of the diluent gas is equal to or greater than 200 mTorr.

Further, the pressure in the chamber is preferably equal to or greater than 300 mTorr.

Furthermore, the patterned thermal oxide film may be formed in a shallow trench isolation structure.

DETAILED DESCRIPTION OF THE EMBODIMENTS

Hereinafter, an embodiment of the present invention will be described with reference to the accompanying drawings.

Figure 1:
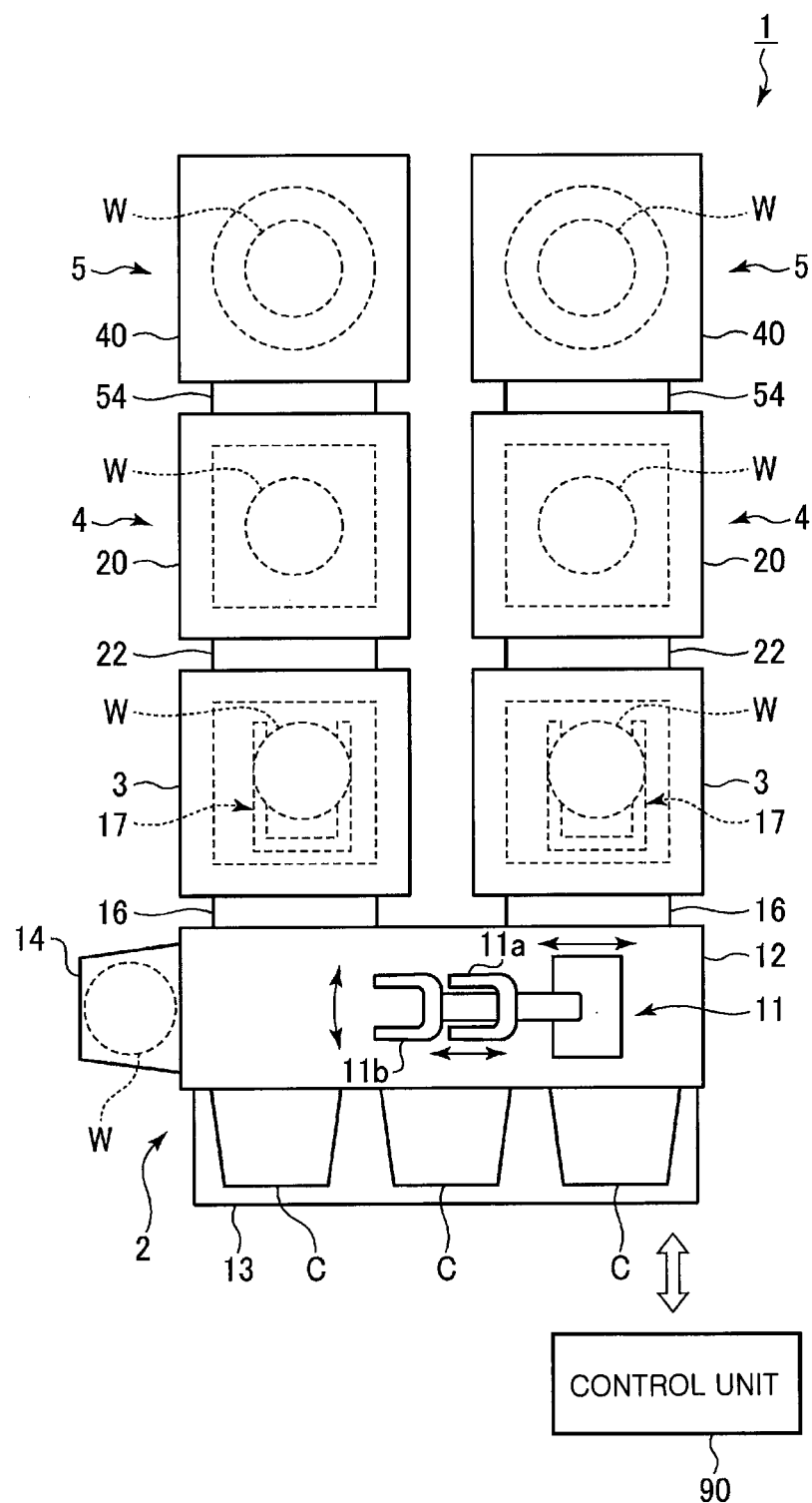
FIG. 1 is a plan view showing a schematic configuration of a processing system according to an embodiment of the present invention.

FIG. 1 is a schematic diagram showing a processing system for performing a gas treatment method according to an embodiment of the present invention. The processing system 1 includes a loading and unloading unit 2 for loading and unloading a semiconductor wafer (hereinafter, simply referred to as a wafer) W, two load-lock chambers (L/L) 3 provided adjacent to the loading and unloading unit 2, PHT processing apparatuses (PHT) 4 respectively provided adjacent to the load-lock chambers 3 to perform a post heat treatment (PHT) process on the wafer W, and COR processing apparatuses (COR) 5 respectively provided adjacent to the PHT processing apparatuses 4 to perform a chemical oxide removal (COR) process on the wafer W. The load-lock chamber 3, the PHT processing apparatus 4 and the COR processing apparatus 5 are arranged side by side in a line in this order.

The loading and unloading unit 2 includes a transfer chamber (L/M) 12 in which a first wafer transfer mechanism for transferring the wafer W is provided. The first wafer transfer mechanism 11 includes two transfer arms 11a and 11b, each holding the wafer W substantially horizontally. A mounting stage 13 is provided at one longitudinal side of the transfer chamber 12. The mounting stage 13 is configured such that, for example, three carriers C each capable of accommodating a plurality of wafers W arranged vertically can be connected to the mounting stage 13. Further, an orienter 14 is installed adjacent to the transfer chamber 12 to perform alignment by optically calculating the eccentric amount by the rotation of the wafer W.

In the loading and unloading unit 2, the wafer W is held by the transfer arm 11a or 11b, is moved vertically or moved straight in a substantially horizontal plane by the driving of the first wafer transfer mechanism 11 and is transferred to a desired position. Then, the wafer W is loaded or unloaded by moving the transfer arm 11a or 11b forward and backward with respect to the carrier C on the mounting stage 13, the orienter 14 and the load-lock chamber 3.

Each of the load-lock chambers 3 is connected to the transfer chamber 12 through a gate valve 16 therebetween. A second wafer transfer mechanism 17 for transferring the wafer W is provided in each of the load-lock chamber 3. Further, each of the load-lock chamber 3 is configured to be evacuable to a predetermined vacuum level.

The second wafer transfer mechanism 17 has a multi-joint arm structure and includes a pick (not shown) holding the wafer W substantially horizontally. In the second wafer transfer mechanism 17, the pick is positioned in the load-lock chamber 3 while the multi-joint arm is being contracted, the pick reaches the PHT processing apparatus 4 by extending the multi-joint arm, and the pick reaches the COR processing apparatus 5 by further extending the multi-joint arm. Accordingly, the wafer W can be transferred between the load-lock chamber 3, the PHT processing apparatus 4 and the COR processing apparatus 5.

Figure 2:
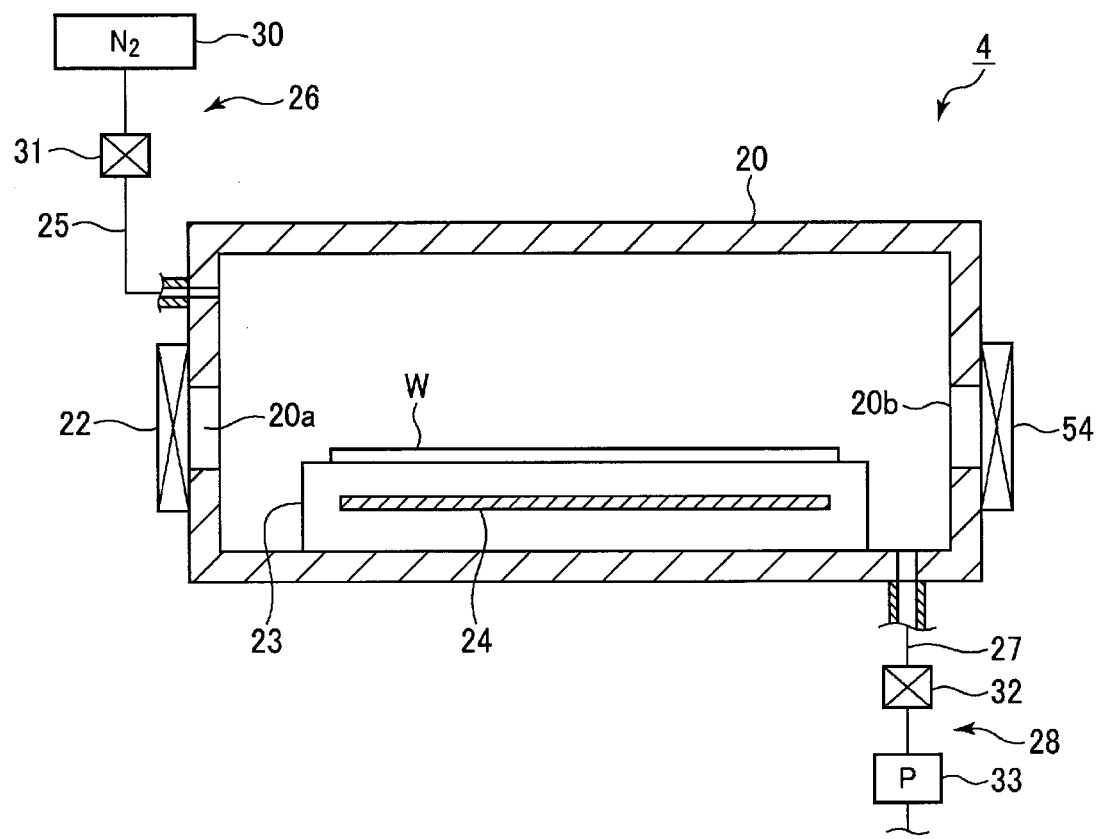
FIG. 2 is a cross-sectional view showing a PHT processing apparatus installed in the processing system of FIG. 1.

As shown in FIG. 2, the PHT processing apparatus 4 includes a chamber 20 capable of being vacuum-evacuated, and a mounting table 23 for mounting the wafer W therein. A heater 24 is embedded in the mounting table 23, and heats the wafer W on which the COR process is performed such that the PHT process which vaporizes (sublimates) a reaction product generated by the COR process can be performed. A transfer port 20a for transferring the wafer W between the chamber 20 and the load-lock chamber 3 is provided at the load-lock chamber side of the chamber 20, and the transfer port 20a is configured to be opened and closed by a gate valve 22. A transfer port 20b for transferring the wafer W between the chamber 20 and the COR processing apparatus 5 is provided at the COR processing apparatus side of the chamber 20, and the transfer port 20b is configured to be opened and closed by a gate valve 54.

Further, the chamber 20 is provided with a gas supply mechanism 26 having a gas supply channel 25 for supplying an inactive gas such as nitrogen gas ($N_2$), and a gas exhaust mechanism 28 having a gas exhaust channel 27 for evacuating the chamber 20. The gas supply channel 25 is connected to a nitrogen gas supply source 30. Further, a flow rate control valve 31 capable of adjusting the supply flow rate of the nitrogen gas, and opening and closing the flow path is provided in the gas supply channel 25. An opening and closing valve 32 and a vacuum pump 33 are provided in the gas exhaust channel 27 of the gas exhaust mechanism 28.

Figure 3:
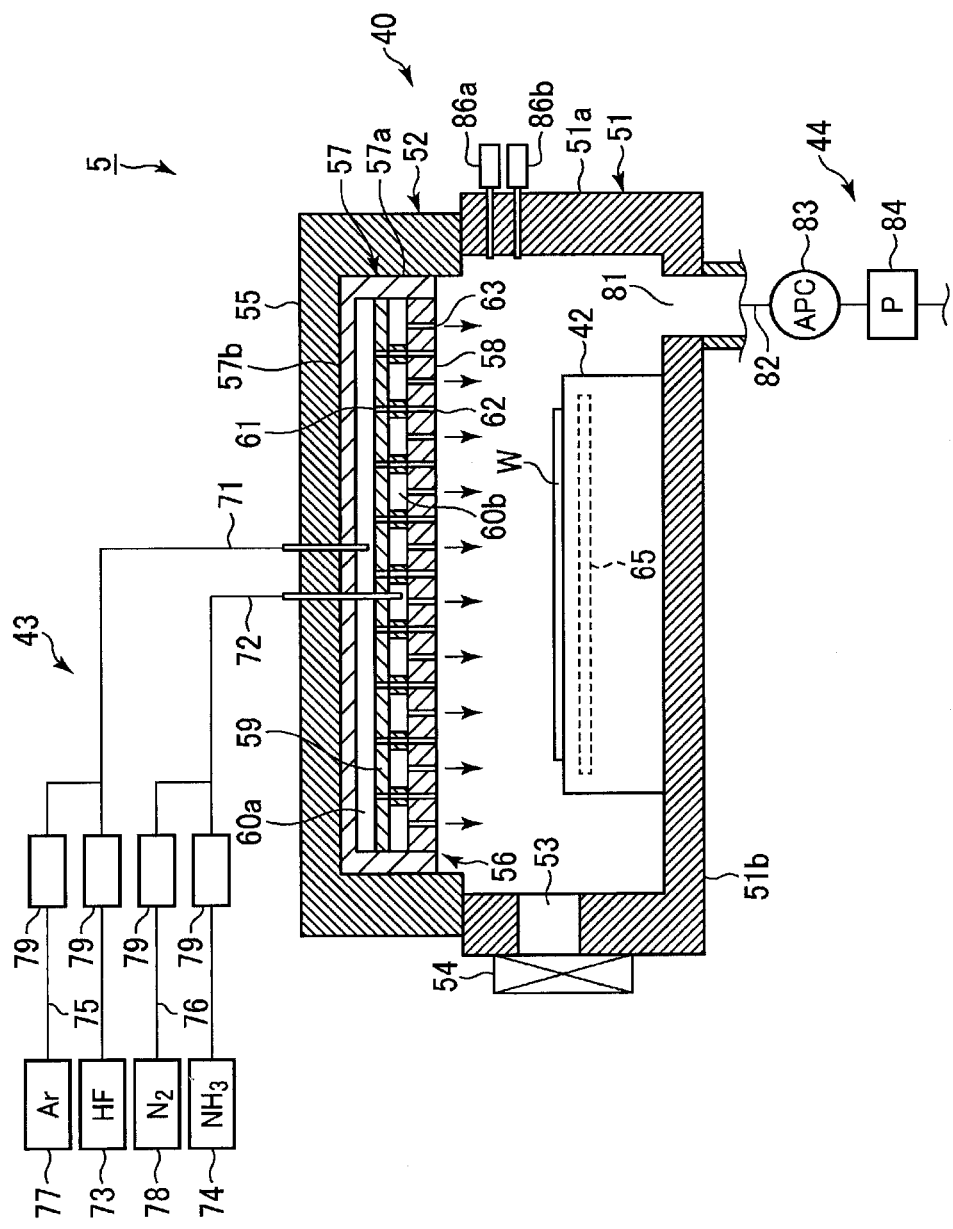
FIG. 3 is a cross-sectional view showing a schematic configuration of a COR processing apparatus installed in the processing system of FIG. 1.

As shown in FIG. 3, the COR processing apparatus 5 includes a chamber 40 having a sealed structure, and a mounting table 42 for mounting the wafer W in a substantially horizontal state is provided in the chamber 40. Further, the COR processing apparatus 5 is provided with a gas supply mechanism 43 for supplying HF gas, $NH_3$ gas and the like, and a gas exhaust mechanism 44 for evacuating the chamber 40.

The chamber 40 includes a chamber body 51 and a lid 52. The chamber body 51 has a substantially cylindrical sidewall portion 51a and a bottom portion 51b. An top portion of the chamber body 51 has an opening, and the opening is closed by the lid 52. The sidewall portion 51a and the lid 52 are sealed by a sealing member (not shown) to ensure airtightness of the chamber 40.

A transfer port 53 for transferring the wafer W to/from the chamber 20 of the PHT processing apparatus 4 is provided in the sidewall portion 51a. The transfer port 53 is configured to be opened and closed by the gate valve 54.

The lid 52 includes a lid member 55 serving as an outer part, and a shower head 56 fitted to the inside of the lid member 55 to face the mounting table 42. The shower head 56 includes a main body 57 having a cylindrical sidewall 57a and a top wall 57b, and a shower plate 58 provided in a bottom portion of the main body 57. In a space defined by the main body 57 and the shower plate 58, a plate 59 is provided parallel to the shower plate 58.

Accordingly, a first space 60a is formed between the top wall 57b of the main body 57 and the plate 59, and a second space 60b is formed between the plate 59 and the shower plate 58.

A first gas supply pipe 71 of the gas supply mechanism 43 is inserted into the first space 60a, and a plurality of gas passages 61 leading to the first space 60a extend to the shower plate 58 through the plate 59. The gas passages 61 lead to first gas injection holes 62 formed in the shower plate 58. On the other hand, a second gas supply pipe 72 of the gas supply mechanism 43 is inserted into the second space 60b, and the second space 60b communicates with a plurality of second gas injection holes 63 formed in the shower plate 58.

A gas supplied to the first space 60a from the first gas supply pipe 71 is injected into the chamber 40 through the gas passages 61 and the first gas injection holes 62. A gas supplied to the second space 60b from the second gas supply pipe 72 is injected through the second gas injection holes 63.

The mounting table 42 has a substantially circular shape in a plan view, and is fixed to the bottom portion 51b of the chamber 40. Inside the mounting table 42, a temperature regulator 65 for regulating temperature of the mounting table 42 is provided. The temperature regulator 65 includes a conduit in which, for example, a temperature regulating medium (e.g., water) is circulated. By performing heat exchange with the temperature regulating medium flowing through the conduit, the temperature of the mounting table 42 is adjusted, and temperature control of the wafer W on the mounting table 42 is achieved.

The gas supply mechanism 43 has the first gas supply pipe 71 and the second gas supply pipe 72 as described above, and includes a HF gas supply source 73 and a $NH_3$ gas supply source 74 connected to the first gas supply pipe 71 and the second gas supply pipe 72, respectively. Further, a third gas supply pipe 75 is connected to the first gas supply pipe 71, and a fourth gas supply pipe 76 is connected to the second gas supply pipe 72. Further, an Ar gas supply source 77 and a $N_2$ gas supply source 78 are connected to the third gas supply pipe 75 and the fourth gas supply pipe 76, respectively. A flow rate controller 79 for controlling the flow rate, and opening and closing the flow path is provided in each of the first to fourth gas supply pipes 71, 72, 75 and 76. The flow rate controller 79 is constituted by, for example, an opening and closing valve and a mass flow controller.

Further, the HF gas and the Ar gas are injected into the chamber 40 from the first gas injection holes 62 through the first gas supply pipe 71, the first space 60a and the gas passages 61. The $NH_3$ gas and the $N_2$ gas are injected into the chamber 40 from the second gas injection holes 63 through the second gas supply pipe 72 and the second space 60b.

Among the above-mentioned gases, the HF gas and the $NH_3$ gas are reactant gases, and configured not to be mixed until they are injected from the shower head 56 such that the reactant gases can be mixed for the first time in the chamber 40. The Ar gas and the $N_2$ gas serve as a diluent gas. When the HF gas and the $NH_3$ gas serving as reactant gases and the Ar gas and the $N_2$ gas serving as a diluent gas are introduced into the chamber 40 at predetermined flow rates while the inside of the chamber 40 is being maintained at a predetermined pressure, the HF gas and the $NH_3$ gas react with an oxide film ($SiO_2$) formed on the wafer W to thereby generate ammonium fluosilicate (AFS) as a reaction product.

The diluent gas may be only Ar gas, or only $N_2$ gas. In the case of using other inactive gases, Ar gas, $N_2$ gas and two or more of other inactive gases may be used.

The gas exhaust mechanism 44 includes a gas exhaust pipe 82 connected to a gas exhaust port 81 formed in the bottom portion 51b of the chamber 40. Further, the gas exhaust mechanism 44 includes an automatic pressure control valve (APC) 83 for controlling the pressure in the chamber 40 and a vacuum pump 84 for evacuating the chamber 40, which are provided in the gas exhaust pipe 82.

In the sidewall portion 51a of the chamber 40, two capacitance manometers 86a and 86b are provided as a pressure gauge for measuring the pressure in the chamber 40. The capacitance manometer 86a is for high pressure, and the capacitance manometer 86b is for low pressure.

As a material for various components such as the chamber 40 and the mounting table 42 constituting the COR processing apparatus 5, Al is used. The Al material forming the chamber 40 may be pure aluminum, or may be anodic oxidized aluminum on an inner surface (an inner surface of the chamber body 51, a lower surface of the shower head 56, etc). Meanwhile, since the surface of the Al constituting the mounting table 42 requires abrasion resistance, it is preferable that an oxide film ($Al_2O_3$) having high abrasion resistance is formed on the surface by performing anodic oxidation treatment.

As shown in FIG. 1, the processing system 1 includes a control unit 90. The control unit 90 includes a controller having a microprocessor (computer) which controls the respective components of the processing system 1. The controller is connected to a keyboard through which an operator inputs a command to manage the processing system 1, a display for visually displaying an operational status of the processing system 1, and so forth. Further, the controller is connected to a storage unit storing a process recipe that is a control program for executing a predetermined process in the components of the processing system 1 depending on the processing conditions, or a control program for realizing under the control of the controller various processes performed by the processing system 1, e.g., the supply of the processing gas in the COR processing apparatus 5 or the evacuation of the chamber 40, and various databases and the like. The recipe is stored in an appropriate storage medium in the storage unit. Then, if necessary, a certain recipe is retrieved from the storage unit and is executed by the controller. Thus, a desired process is performed in the processing system 1 under the control of the controller.

Next, a gas treatment method of the present embodiment using the processing system 1 will be described.

Figure 4:
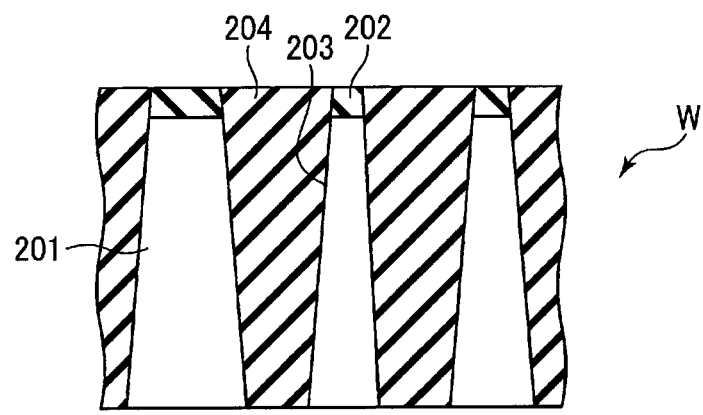
FIG. 4 is a cross-sectional view showing a structure of an object to be processed (wafer) which is applied to the embodiment of the present invention.

In this embodiment, a patterned silicon oxide film formed on a surface of the wafer W is etched. For example, as shown in FIG. 4, shallow trenches 203 are formed in a silicon substrate 201 having a thermal oxide film 202, and the shallow trenches 203 are filled with a silicon oxide film (TEOS-$SiO_2$ film) 204 by CVD using TEOS, thereby preparing the wafer W having a shallow trench isolation (STI) structure. The patterned thermal oxide film 202 remaining on the surface is etched by the processing system 1.

First, the wafer W in a state shown in FIG. 4 is accommodated in the carrier C and is transferred to the processing system 1. In the processing system 1, one wafer W is transferred to the load-lock chamber 3 by the transfer arm 11a or 11b of the first wafer transfer mechanism 11 from the carrier C of the loading and unloading unit 2 while the atmospheric side gate valve 16 is open, and delivered to the pick of the second wafer transfer mechanism 17 in the load-lock chamber 3.

Thereafter, the atmospheric side gate valve 16 is closed and the load-lock chamber 3 is evacuated. Then, after opening the gate valves 22 and 54, the wafer W is loaded on the mounting table 42 by extending the pick to the COR processing apparatus 5.

Then, the pick is returned to the load-lock chamber 3, and the chamber 40 is sealed by closing the gate valves 22 and 54. In this state, the temperature of the wafer W on the mounting table 42 is adjusted to a predetermined target value (e.g., 20° C.-40° C.) by the temperature regulator 65. Further, from the gas supply mechanism 43, the HF gas and the Ar gas are injected into the chamber 40 from the first gas injection holes 62 through the first gas supply pipe 71, the first space 60a and the gas passages 61, and the $NH_3$ gas and the $N_2$ gas are injected into the chamber 40 from the second gas injection holes 63 through the second gas supply pipe 72 and the second space 60b.

Accordingly, the HF gas and the $NH_3$ gas are supplied into the chamber 40 without being mixed in the shower head 56, and the atmosphere in the chamber 40 becomes an atmosphere containing the HF gas and the $NH_3$ gas. The thermal oxide film 202 remaining on the surface of the wafer W selectively reacts with these gases.

That is, the thermal oxide film 202 undergoes a chemical reaction with the molecules of hydrogen fluoride gas and the molecules of ammonia gas to generate ammonium fluosilicate (AFS) and water as a reaction product, which are held on the surface of the wafer W.

After such processing is completed, the gate valves 22 and 54 are opened, and the processed wafer W on the mounting table 42 is transferred by the pick of the second wafer transfer mechanism 17 and mounted on the mounting table 23 in the chamber 20 of the PHT processing apparatus 4. Thereafter, the pick is retracted to the load-lock chamber 3 and the gate valves 22 and 54 are closed. Then, the wafer W on the mounting table 23 is heated by the heater 24 while the $N_2$ gas is being introduced into the chamber 20. Thus, the reaction product generated by the COR process is heated, vaporized and removed.

As described above, by performing the PHT process after the COR process, it is possible to remove the thermal oxide film 202 in a dry atmosphere, and water marks and the like do not occur. Also, it is possible to perform the treatment with less damage by plasma-less etching. Further, the etching can be performed with high selectivity with respect to the TEOS-$SiO_2$ film. In addition, in the COR process, since the etching does not proceed after a lapse of a predetermined time period, the reaction does not proceed even if over-etching is performed, and the end point management is not required.

Figure 5:
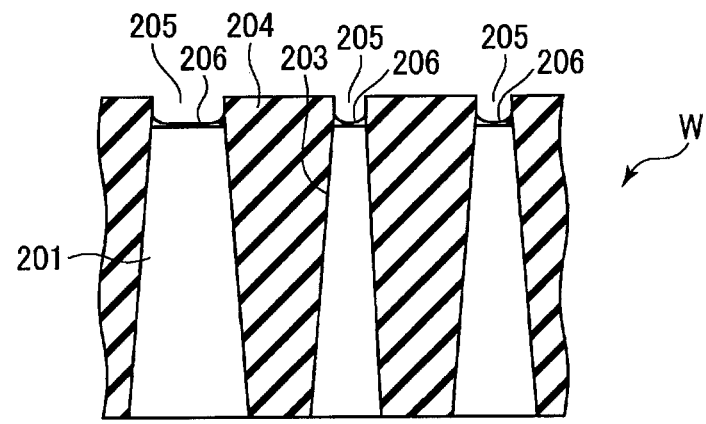
FIG. 5 is a schematic diagram showing a state of a pattern when the pattern of 50 nm or less is etched by heat treatment after performing a COR process under conventional conditions.

Conventionally, the COR process has been carried out under the conditions in which the pressure in the chamber is 10 to 100 mTorr (1.33 to 13.3 Pa), the temperature of the semiconductor wafer is 20 to 40° C., and the flow rate of the total gas is 100 to 200 sccm (mL/min). In this case, the etching rate at the bottom of the pattern may decrease with miniaturization of the pattern, and the silicon oxide film may remain at the bottom of the pattern. FIG. 5 is a diagram showing a state of a pattern when the pattern of 50 nm or less is etched by heat treatment after performing the COR process under the conventional conditions. As shown in this figure, an etching residue 206 of the thermal oxide film occurs at the bottom of a pattern 205 obtained by etching.

The etching residue is eliminated, generally, by increasing the temperature of the treatment to increase the etching rate.

Figure 6:
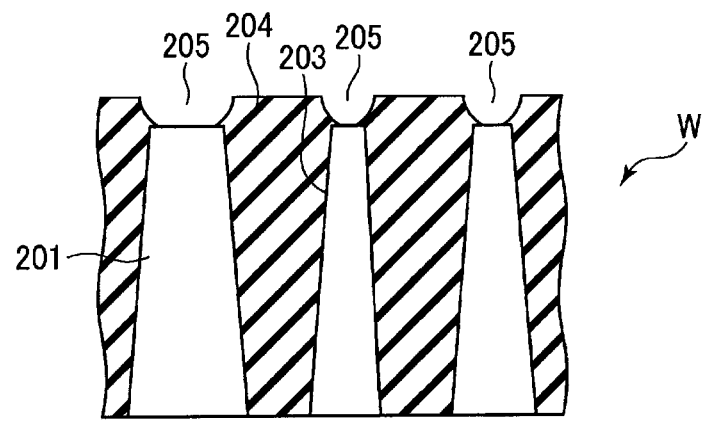
FIG. 6 is a schematic diagram showing a state of a pattern when it is etched by heat treatment after performing a COR process under conditions that the temperature is increased in comparison to FIG. 5.

However, it has been found that when the temperature is increased, as shown in FIG. 6, the etching residue is eliminated, but the etching shape deteriorates.

Therefore, studies have been conducted in order to achieve both desired etching shape and etching property. As a result, it has been found that it is possible to achieve both desired etching shape and etching property by increasing the pressure without basically changing the temperature and the amount of the reactant gases.

That is, since reactive species (HF and $NH_3$) are easily adsorbed at the temperature of 20 to 40° C., at the time of pattern etching of the thermal oxide film, etching is less likely to proceed at the bottom of the pattern, and the etching residue occurs. When the temperature is increased in order to prevent this phenomenon, since the reaction is more dominant than the adsorption, it is possible to etch the thermal oxide film without causing the etching residue. However, since the TEOS-$SiO_2$ film is also etched due to the increase in temperature, it is difficult to etch with high selectivity. As a result, the etching shape (verticality) deteriorates.

On the contrary, in the case of increasing the pressure without increasing the temperature, since the mean free path of reactive species is shortened, the movement of the reactive species is limited, and straightness increases. Thus, the reactive species effectively act on the thermal oxide film at the bottom of the pattern and the verticality of the etching is further increased.

Therefore, in this embodiment, by increasing the pressure in the chamber 40, an etching residue is prevented from occurring and a favorable etching shape is obtained. That is, the pressure in the chamber 40 is increased by increasing the amount of the diluent gas while maintaining the processing temperature and the flow rates of the HF gas and the $NH_3$ gas that are reactant gases. This makes it possible to improve the etching profile and the etching property.

As specific conditions, the processing temperature is 40° C. or less, preferably, 35° C. or less, the HF gas flow rate is 10 to 100 sccm (mL/min), and the $NH_3$ gas flow rate is 10 to 100 sccm (mL/min). The pressure in the chamber 40 is preferably set to 200 mTorr (26.7 Pa) or more by increasing the total flow rate of the Ar gas and the $N_2$ gas serving as a diluent gas. More preferably, the pressure in the chamber 40 is 300 mTorr (40.0 Pa) or more.

The total flow rate of the Ar gas and the $N_2$ gas serving as a diluent gas is preferably set to 500 sccm (mL/min) or more, and more preferably set to 800 sccm (mL/min) or more. Further, preferably, the partial pressure of the HF gas is 5 to 50 mTorr (0.67 to 6.7 Pa), the partial pressure of the $NH_3$ gas is 5 to 50 mTorr (0.67 to 6.7 Pa) and the partial pressure of the diluent gas is 200 mTorr (26.7 Pa) or more.

Actually, the COR process was carried out by changing the pressure under the conditions in which the temperature is 40° C. or less, the flow rate of the HF gas is 10 to 100 sccm (mL/min) and the flow rate of the $NH_3$ gas is 10 to 100 sccm (mL/min). Conditions A are the conventional conditions in which the pressure in the chamber 40 is 10 to 100 mTorr, and Conditions B are high pressure conditions in which the pressure in the chamber 40 is 200 mTorr or more. Then, heat treatment was performed by the PHT processing apparatus to remove the AFS that is a reaction product.

Figure 7:
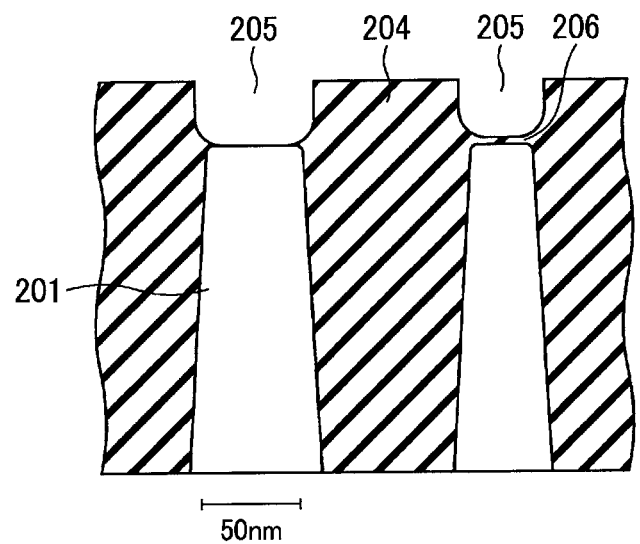
FIG. 7 is a schematic diagram showing a state of a pattern when it is subjected to heat treatment after performing a COR process under conventional conditions in which the pressure is set to 10 to 100 mTorr.
Figure 8:
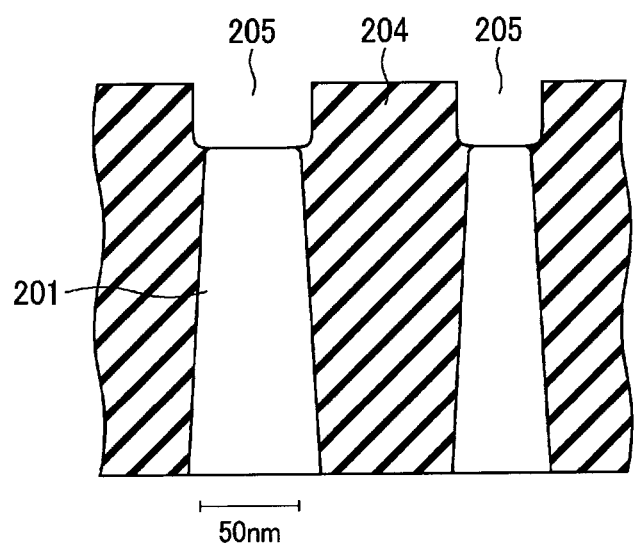
FIG. 8 is a schematic diagram showing a state of a pattern when it is subjected to heat treatment after performing a COR process under high pressure conditions in which the pressure is set to 200 mTorr or more.

FIGS. 7 and 8 are schematic diagrams showing a state of the pattern after etching under these conditions. As shown in these figures, the verticality of the pattern 205 is good in both cases. However, under conditions A that are conventional conditions, only a rounded portion was formed at the bottom of the pattern 205 when the pattern size is greater than 50 nm, but the etching residue 206 of the thermal oxide film occurred when the pattern size is smaller than 50 nm. In contrast, under conditions B, an etching residue of the thermal oxide film did not occur even if the pattern size is smaller than 50 nm. From this, it has been confirmed that a high pressure is effective in order to achieve a desired etching shape without generating an etching residue.

As described above, according to this embodiment, since the pressure in the chamber is controlled by adjusting the amount of the diluent gas, it is possible to perform etching with high verticality without the etching residue.

The present invention can be variously modified without being limited to the above embodiment. For example, in the above embodiment, the present invention has been applied to etching of the thermal oxide film in a shallow trench isolation structure, but it is also applicable to etching of a silicon oxide film in other structures, and etching of other silicon oxide films without being limited to the thermal oxide film. In addition, the Ar gas and the $N_2$ gas are used as a diluent gas, but only Ar gas or only $N_2$ gas may be used. In the case of using other inactive gases, two or more of Ar gas, $N_2$ gas and other inactive gases may be used. Further, in the above embodiment, an example of continuously transferring objects to be processed one by one has been described, but objects to be processed may be continuously transferred two by two or more.

What is claimed is:

1. An oxide etching method comprising:
    loading an object to be processed in a chamber, wherein a top surface of the object comprises a patterned silicon oxide film composed of a thermal oxide and a CVD (chemical vapor deposition) oxide formed by CVD, the thermal oxide and the CVD oxide are disposed side by side;
    supplying HF gas and $NH_3$ gas as reactant gases and a diluent gas to the chamber to conduct a reaction treatment in which the thermal oxide and the CVD oxide are simultaneously exposed to the HF gas and the $NH_3$ as so that the HF gas and the $NH_3$ gas react with the patterned silicon oxide film; and performing a heating process to remove a reaction product generated by the reaction treatment, wherein during the reaction treatment, a pressure in the chamber is set to be equal to or greater than 200 mTorr and a temperature of the object is set to be equal to or lower than 40° C. so that the thermal oxide is selectively etched compared to the CVD oxide during the reaction treatment and substantially no etching residue remains and an etching shape of the object has improved verticality after the heating process.

2. The oxide etching method of claim 1, wherein the temperature of the object to be processed in the reaction treatment is equal to or less than 35° C.

3. The oxide etching method of claim 1, wherein flow rates of the HF gas, the $NH_3$ gas and the diluents gas are adjusted such that in the chamber, a partial pressure of the HF gas is 5 to 50 mTorr, a partial pressure of the $NH_3$ gas is 5 to 50 mTorr, and a partial pressure of the diluent gas is equal to or greater than 200 mTorr.

4. The oxide etching method of claim 1, wherein during the reaction treatment, the pressure in the chamber is set to be equal to or greater than 300 mTorr.

5. The oxide etching method of claim 1, wherein the object includes a shallow trench isolation structure and the structure is filled with the CVD oxide.

6. The oxide etching method of claim 1, wherein the CVD oxide is formed by using TEOS (tetraethyl orthosilicate).

* * * * *